US012652069B1

(12) United States Patent
Ying

(10) Patent No.: US 12,652,069 B1
(45) Date of Patent: Jun. 9, 2026

(54) ULTRA-WIDEBAND UP-CONVERSION N-PATH MIXER WITH BANDPASS REJECTION OF ODD HARMONIC FREQUENCIES

(71) Applicant: HRL Laboratories, LLC, Malibu, CA (US)

(72) Inventor: Robin C. Ying, Alhambra, CA (US)

(73) Assignee: HRL Laboratories, LLC, Malibu, CA (US)

( * ) Notice: Subject to any disclaimer, the term of this patent is extended or adjusted under 35 U.S.C. 154(b) by 8 days.

(21) Appl. No.: 18/822,014

(22) Filed: Aug. 30, 2024

Related U.S. Application Data

(60) Provisional application No. 63/635,462, filed on Apr. 17, 2024.

(51) Int. Cl.
*H04B 1/12* (2006.01)
*H03D 7/12* (2006.01)

(52) U.S. Cl.
CPC ................. *H04B 1/12* (2013.01); *H03D 7/12* (2013.01)

(58) Field of Classification Search
CPC .................................... H04B 1/12; H03D 7/12
See application file for complete search history.

(56) References Cited

U.S. PATENT DOCUMENTS

| | | | | | |
|---|---|---|---|---|---|
| 7,769,361 | B2 * | 8/2010 | Zhuo | .................... | H03D 7/1466 |
| | | | | | 455/333 |
| 8,442,464 | B2 * | 5/2013 | Amrutur | ................. | H03F 3/211 |
| | | | | | 455/341 |
| 9,520,833 | B1 * | 12/2016 | Wyse | .................... | H03D 7/1458 |
| 12,149,251 | B2 * | 11/2024 | Kim | ....................... | H03B 19/14 |

OTHER PUBLICATIONS

D. Dimlioglu et al.; "Demonstration of a Ku-Band N-Path Downconverter in GaN-on-SiC," Proceedings of the 2023 IEEE BiCMOS and Compound Semiconductor Integrated Circuits and Technology Symposium (BCICTS); pp. 106-109, 2023, IEEE.

(Continued)

*Primary Examiner* — Dac V Ha

(74) *Attorney, Agent, or Firm* — Wheatstone IP Law Corporation; Milad G. Shara

(57) ABSTRACT

A receiver circuit comprises a local oscillator (LO) signal generator that provides LO reference voltage signals, and a plurality of up-conversion paths that provide filtered up-converted signals. Each up-conversion path comprises a transistor and a bandpass filter. A drain of the transistor provides a mixed signal in response to one of the LO reference voltage signals at a gate of the transistor and an RF input signal at a source of the transistor. The bandpass filter has a fixed frequency that passes a first frequency component associated with a center frequency of the RF input signal and rejects a second frequency component associated with an undesired frequency in the mixed signal to provide one of the filtered up-converted signals. The fixed bandpass frequency may reject a plurality of second frequency components that are associated with a plurality of undesired frequencies of the RF input signal.

21 Claims, 11 Drawing Sheets

(56) References Cited

OTHER PUBLICATIONS

Y. Zhu et al.; "A 38-GS/s 7-bit Pipelined-SAR ADC with Speed-Enhanced Bootstrapped Switch and Output Level Shifting Technique in 22-nm FinFET," IEEE Journal of Solid-State Circuits, vol. 58, No. 8; pp. 2300-2313; Aug. 2023, IEEE.

E. Zolkov et al.; "A 1-2-GHz Quadrature Balanced N-Path Receiver for Frequency Division Duplex Systems." IEEE Transactions on Microwave Theory and Techniques, vol. 70, No. 1, pp. 597-612, Jan. 2022.

R. Ying et al.; "A 20-40 GHz High Dynamic Range HBT N-Path Receiver With 8.9 dBm OOB B1dB and 8.55 dB NF Consuming 130 mW," Proceedings of the 2021 IEEE Radio Frequency Integrated Circuits Symposium (RFIC); pp. 215-218, 2021, IEEE.

R. Ying et al.; "Impedance Transparency and Performance Metrics of HBT-Based N-Path Mixers for mmWave Applications," IEEE Transactions on Circuits and Systems I: Regular Papers, vol. 68, No. 5; pp. 2210-2223, May 2021, IEEE.

M. Morton et al.; "The RF Sampler: Chip-Scale Frequency Conversion and Filtering Enabling Affordable Element-Level Digital Beamforming," Proceedings of the IEEE International Microwave Symposium (IMS); pp. 14-18, 2018, IEEE.

R. Ying et al.; "A HBT-Based 300 MHZ-12 GHz Blocker-Tolerant Mixer-First Receiver," Proceedings of the IEEE Bipolar/BiCMOS Circuits and Technology Meeting (BCTM); pp. 31-34, 2017, IEEE.

N.M. Amin et al.; "An I/Q mixer with an integrated differential quadrature all-pass filter for on-chip quadrature LO signal generation", Journal of Semiconductors, vol. 36, No. 5, May 2015, pp. 055001-1 to 055001-9. Chinese Institute of Electronics.

K. Shinohara et al.; "Scaling of GaN HEMTs and Schottky Diodes for Submillimeter-Wave MMIC Applications," IEEE Transactions on Electron Devices, vol. 60, No. 10; pp. 2982-2996, Oct. 2013, IEEE.

C. Andrews et al.; "A Passive Mixer-First Receiver With Digitally Controlled and Widely Tunable RF Interface," IEEE Journal of Solid-State Circuits, vol. 45, No. 12; pp. 2696-2708, Dec. 2010, IEEE.

M. Do et al.; "AIGaN/GaN Mixer MMICs, and RF Front-End Receivers for C-, Ku-, and Ka-Band Space Applications," Proceedings of the 5th European Microwave Integrated Circuits Conference (EuMIC); pp. 57-60, Paris, France, 2010, IEEE.

* cited by examiner

Figure 5:
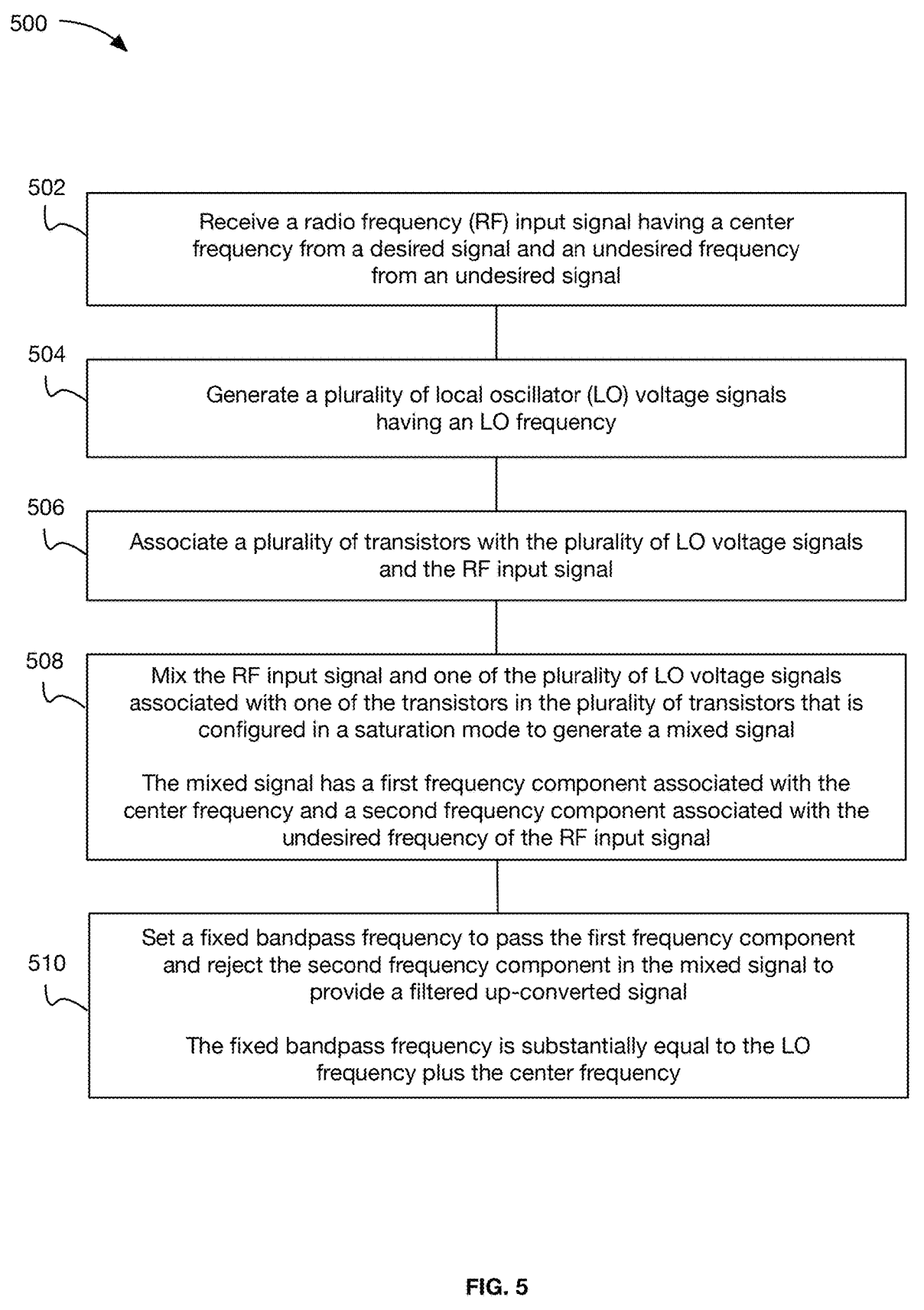

500

502

Receive a radio frequency (RF) input signal having a center frequency from a desired signal and an undesired frequency from an undesired signal

504

Generate a plurality of local oscillator (LO) voltage signals having an LO frequency

506

Associate a plurality of transistors with the plurality of LO voltage signals and the RF input signal

508

Mix the RF input signal and one of the plurality of LO voltage signals associated with one of the transistors in the plurality of transistors that is configured in a saturation mode to generate a mixed signal The mixed signal has a first frequency component associated with the center frequency and a second frequency component associated with the undesired frequency of the RF input signal

510

Set a fixed bandpass frequency to pass the first frequency component and reject the second frequency component in the mixed signal to provide a filtered up-converted signal The fixed bandpass frequency is substantially equal to the LO frequency plus the center frequency

FIG. 5 filter signal
120n

126n mixed
signal
130n

600

600

Idealized Model Diagram
(Down-conversion N-Path Passive Mixer/Filter)
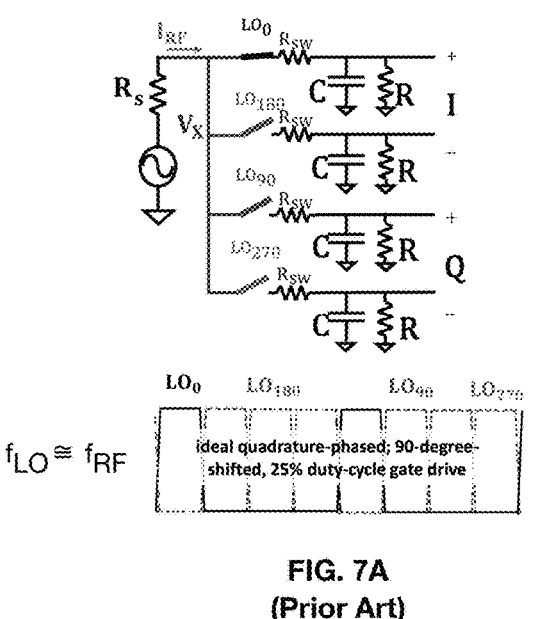
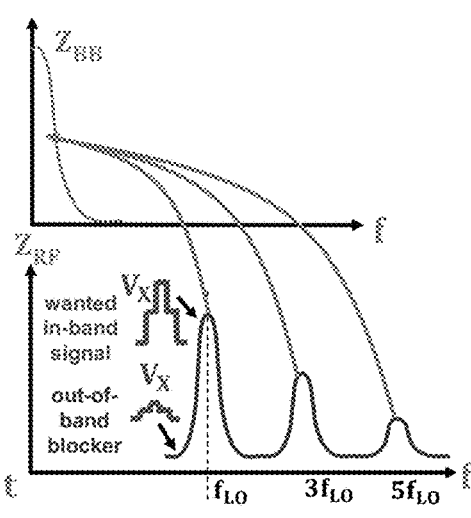
FIG. 7A
(Prior Art)
FIG. 7B
(Prior Art)
Idealized Model Diagram
(Up-conversion N-Path Passive Mixer)
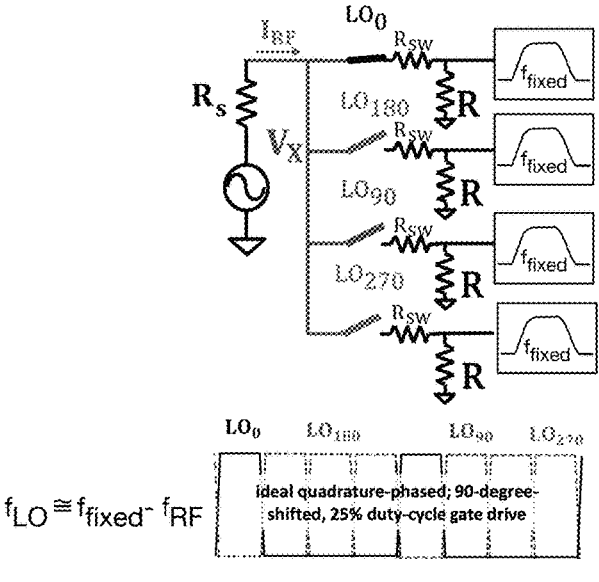
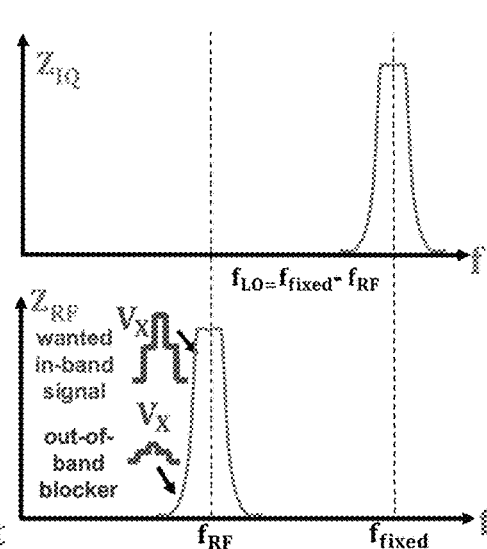
FIG. 8A
FIG. 8B

ULTRA-WIDEBAND UP-CONVERSION N-PATH MIXER WITH BANDPASS REJECTION OF ODD HARMONIC FREQUENCIES

CROSS-REFERENCE TO RELATED APPLICATIONS

The present application claims priority to U.S. Provisional Application No. 63/635,462 entitled ULTRA-WIDEBAND UP-CONVERSION N-PATH MIXER filed on Apr. 17, 2024, the entirety of which is hereby incorporated by reference.

TECHNICAL FIELD

The present description relates to N-path mixers and radio frequency receiver circuits.

BACKGROUND

Radio frequency (RF) receivers have N-path mixers that are being developed for mm-wave frequency range. However, RF receivers are vulnerable to odd harmonic frequencies resulting from local oscillator (LO) signals periodically activating transistors in the N-path mixers. Consequently, undesired signals residing at these harmonic frequencies can leak into and corrupt desired signals in baseband.

There is a need for RF receivers that prevent undesired signals at harmonic frequencies of the LO signal from leaking into baseband signals.

DESCRIPTION OF DRAWINGS

FIG. 5 is a diagram showing a method of rejecting an undesired frequency in a radio frequency (RF) input signal according to an embodiment.

FIGS. 7A-7B are diagrams of showing odd harmonics leaking into baseband conversion with conventional N-path passive mixer/filter.

FIGS. 8A-8B are diagrams illustrating rejection of odd harmonics from mixed signal using up-converting N-path passive mixer with bandpass filtering according to an embodiment.

Like reference symbols in the various figures indicate like elements.

DETAILED DESCRIPTION

Figure 1:
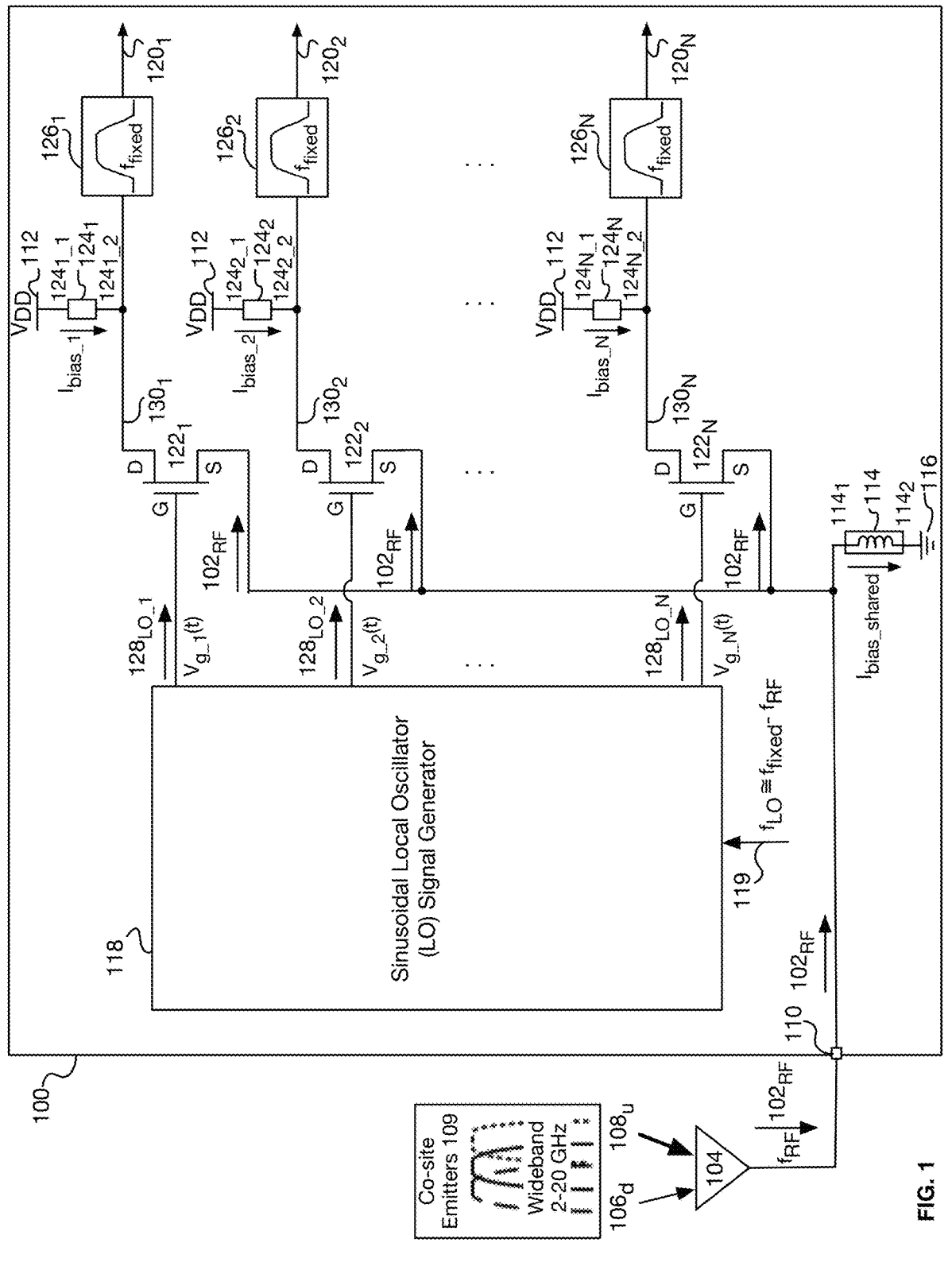
FIG. 1 is a diagram illustrating a receiver circuit with up-conversion paths that reject odd harmonics in mixed signals according to an embodiment.

The disclosed embodiments illustrate methods and receiver circuits having up-conversion paths with mixers and bandpass filters for rejecting an undesired frequency in a radio frequency (RF) input signal. The bandpass filters have a fixed bandpass frequency to pass a first frequency component such as a sum frequency component, and reject one or more second frequency components such as difference frequency components in mixed signals. The first frequency component is associated with the center frequency of the RF input signal and the second frequency components are associated with undesired frequencies of the RF input signal. The fixed bandpass frequency is substantially equal to the center frequency plus a local oscillator (LO) frequency that drives switches in mixers providing the mixed signals.

The disclosed embodiments further illustrate up-conversion architecture that leverages the wide impedance matching of N-path mixers and the high-power linearity and high-frequency operability of GaN. For example, the up-conversion may be fabricated on GaN in a 40 nm process with a fT/fMAX of 160/360 GHz and 60V breakdown. The gate breakdown is sufficient for handling ~10 W of power incident on a GaN switch, and the high fT is suitable for fast switching and for the low insertion-loss/noise that receivers demand. The up-converter architecture may be configured with 29-31 GHz fixed active elliptic bandpass filter load that passes signal back to RF within 1 GHz of the LO frequency $f_{LO}$. Signals out-of-band and filtered outside of the 29-31 GHz range are suppressed beyond 1 GHz of the LO frequency $f_{LO}$.

The disclosed embodiments illustrate a high dynamic range receiver design with N-path up-conversion mixers and bandpass filters. The embodiments include integrated wideband quadrature generation with a mixer core. In an embodiment, the N-path up-conversion is configured in an active mixer architecture that allows for relaxed gate drive signal generation allowing for high-dynamic range performance over a decade of tuning range, according to an embodiment. For example, an active 4 phase N-path filter in GaN can achieve noise performance of ~6 dB as well as linearity of >30 dBm P1dB out-of-band across 2-28 GHz while driven by quadrature-phased sinusoids due to active current-steering architecture according to an embodiment. Also, the embodiments of the ultra-high dynamic range receivers and transceivers may be configured with tunable/selectable bands for down-conversion to baseband while achieving high power handling/linearity, higher sensitivity, and lower power consumption.

According to various embodiments, the RF input signal may have desired and undesired components received from an antenna that may operate in the presence of high-power co-site interference from an undesired interference signal. The undesired interference signal may (i) degrade, weaken, or distort the desired input signal in applications such as communication or radar systems, (ii) introduce unwanted noise or disturbance that affects clarity and reliability of the desired input signal, or (iii) cause the receiver or associated devices to malfunction or operate unpredictably. For example, the desired input signal may be a radar signal for electronic support measures (ESM), the undesired interference signal may be emitted from co-site jammers or other emitters, and the receiver with the up-conversion N-path mixer may be an electronic intelligence (ELINT) receiver configured to listen for the desired input signal extending through a Ka-band frequency range of approximately 26.5 GHz to 40 GHz according to embodiments.

The disclosed embodiments include an indexed numbering system with subscripts having lowercase letters n and c to identify 1) an $n^{th}$ up-conversion path in a number of N parallel up-conversion paths, where n is an integer 1 to N, and N is an integer of 2 or more, and 2) a $c^{th}$ periodic sinusoidal intersections in a number of C periodic sinusoidal intersections, where C=N. The $n^{th}$ up-conversion path includes an $n^{th}$ transistor and $n^{th}$ bandpass filter. The $c^{th}$ periodic sinusoidal intersection corresponds to a $c^{th}$ commutation period for transitioning between an $n^{th}$ transistor in a current $n^{th}$ up-conversion path and an (n+1)th transistor in a next (n+1)th up-conversion path.

FIG. 1 illustrates a receiver circuit 100 that is configured for rejecting an undesired frequency $f_u$ in a radio frequency (RF) input signal $102_{RF}$. The RF input signal $102_{RF}$ may include a desired or intended input signal $106_d$ and an undesired or unintended interference signal $108_u$ emitted from desired and undesired co-site emitters 109 in close proximity. The desired input signal $106_d$ has the center frequency $f_{RF}$ and the undesired signal $108_u$ has the undesired frequency $f_u$. For example, the desired input signal $106_d$ has the center frequency $f_{RF}$ within a mm-wave frequency range of 2 GHz to 40 GHZ, and the desired input signal $106_d$ may have a bandwidth occupying less than this range. The undesired interference signal $108_u$ may occupy a distinct spectral portion of the same 2-40 GHz mm-wave range as that occupied by the desired input signal $106d$.

The receiver circuit 100 includes an RF input terminal 110 configured to receive the RF input signal $102_{RF}$, and a local oscillator (LO) signal generator configured to provide a plurality of reference voltage signals having an LO frequency $f_{LO}$. According to an embodiment illustrated in the receiver circuit 100, the (LO) signal generator may be a sinusoidal signal generator 118 configured to generate a plurality of sinusoidal voltage signals $128_{LO\_n}$ having the LO frequency $f_{LO}$ and a time varying amplitude $V_{g\_n}(t)$. The receiver circuit 100 further includes a plurality of up-conversion paths configured to provide a plurality of filtered up-converted signals $120_{1:N}$. The plurality of sinusoidal voltage signals $128_{LO\_1:N}$ include a phase shift $\Phi$ between each of the sinusoidal voltage signals $128_{LO\_n}$, and the phase shift $\Phi$ is determined by the number of up-conversion paths in the plurality of up-conversion paths. Each sinusoidal voltage signal signals $128_{LO\_n}$ has a phase angle $\theta$ that is determined by the phase shift $\Phi$. The time varying amplitudes are delayed versions of each other.

The sinusoidal LO signal generator 118 may be a tunable sinusoidal LO signal generator that generates the plurality of sinusoidal voltage signals $128_{LO\_1:N}$ in response to a single-ended sinusoidal voltage signal 119. The single-ended sinusoidal voltage signal 119 is tuned to provide the LO frequency $f_{LO}$. According to embodiments, the LO frequency $f_{LO}$ may be in a frequency range of 2 GHz to 40 GHz and the transistor $122_n$ in each up-conversion path may be configured to mix the RF input signal $102_{RF}$ within the frequency range of 2 GHz to 40 GHz.

Each up-conversion path in the plurality of up-conversion paths comprises a transistor $122_n$ and a bandpass filter $126_n$. For each up-conversion path, the transistor $122_n$ has a source coupled to the RF input terminal 110, and a drain coupled to the bandpass filter $126_n$, and a gate coupled to the LO signal generator 118 to receive one of the sinusoidal voltage signals $128_{LO\_n}$. The drain of the transistor $122_n$ is configured to provide a mixed signal $130n$ in response to the one of the sinusoidal voltage signals $128_{LO\_n}$ at the gate of the transistor $122_n$ and the RF input signal $102_{RF}$ at the source of the transistor $122_n$.

According to an aspect, the bandpass filter $126_n$ is configured at a fixed bandpass (BP) frequency $f_{ixed}$ to pass a first frequency component such as a sum frequency component, and reject one or more second frequency components such as difference frequency components in the mixed signal $130_n$ to provide one of the filtered up-converted signals $120_n$ in the plurality of filtered up-converted signals $120_{1:N}$. The first frequency component is associated with the center frequency $f_{RF}$ and the second frequency components are associated with undesired frequencies such as the undesired frequency $f_u$ of the RF input signal $102_{RF}$. According to an embodiment, the fixed bandpass frequency $f_{ixed}$ may be configured to reject a plurality of second frequency components that are associated with a plurality of undesired frequencies of the RF input signal $102_{RF}$.

The fixed bandpass frequency $f_{fixed}$ is substantially equal to the LO frequency $f_{LO}$ of the sinusoidal voltage signals $128_{LO\_N}$ plus the center frequency $f_{RF}$ of the RF input signal $102_{RF}$. The mixed signal $130_n$ comprises at least one second frequency component associated with at least one odd harmonic frequency as a consequence of one of the sinusoidal voltage signals $128_{LOn}$ driving the gate of the transistor $122_n$ to periodically configure the transistor $122_n$ to operate in a saturation mode. The at least one odd harmonic frequency is associated with the undesired frequency in the RF input signal $102_{RF}$.

The LO frequency $f_{LO}$ may be determined from the fixed bandpass frequency $f_{fixed}$ minus the center frequency $f_{RF}$. The fixed bandpass frequency $f_{fixed}$ may be determined from a range of center frequencies $f_{RF\_min}$ to $f_{RF\_max}$ and another range of undesired frequencies $f_u$ min to $f_u$ max. For example, the fixed bandpass frequency $f_{fixed}$ may be greater than at least 1.5 times the maximum center frequency $f_{RF\_max}$ plus 0.5 times the maximum undesired frequency $f_{u\_max}$. The fixed bandpass frequency $f_{fixed}$ may be at least 8 GHz according to embodiments.

According to an embodiment, the receiver circuit 100 may include a direct current (DC) voltage supply rail 112 configured to provide a DC voltage supply VDD, and a shared current source 114 configured to draw a shared bias current $I_{bias\_shared}$ from the DC voltage supply VDD to a ground terminal 116. The ground terminal 116 is coupled to one end $114_2$ of the shared current source 114. The DC voltage supply VDD may be configured as a pull-up supply, and the shared current source 114 may include an inductor configured as an RF choke and a DC biasing inductor shunt to the ground terminal 116 according to an embodiment.

For each up-conversion path, a load impedance $124_n$ has one end $124_{n\_1}$ coupled to the DC voltage supply rail 112. A source of the transistor $122_n$ is coupled to the RF input terminal 110 and to another end $114_1$ of the shared current source 114. A drain of the transistor $122_n$ is coupled to another end $124_{n\_2}$ of the impendence load $124_n$ and to the bandpass filter $126_n$. A gate of the transistor $122_n$ is coupled to the sinusoidal LO signal generator 118 to receive one of the plurality of sinusoidal voltage signals $128_{LO\_n}$. The shared bias current $I_{bias\_shared}$ is steered as a bias current $I_{bias\_n}$ to the transistor $122_n$ in response to the time varying amplitude $V_{g\_n}(t)$ of the one of the plurality of sinusoidal voltages signals $128_{LO\_n}$ associated with the gate of the transistor $122_n$.

The drain of the transistor $122_n$ is configured to provide the mixed signal $130_n$ in response to the time varying amplitude $V_{g\_n}(t)$ of the $n^{th}$ sinusoidal voltage signal $128_{LO\_n}$, the shared bias current $I_{bias\_shared}$, and the RF input signal $102_{RF}$. The spectral content of the mixed signal $130_n$ comprises a sum and difference frequencies of (a) the RF input signal $102_{RF}$ and (b) the sinusoidal voltage signals $128_{LO\_n}$.

Figure 2:
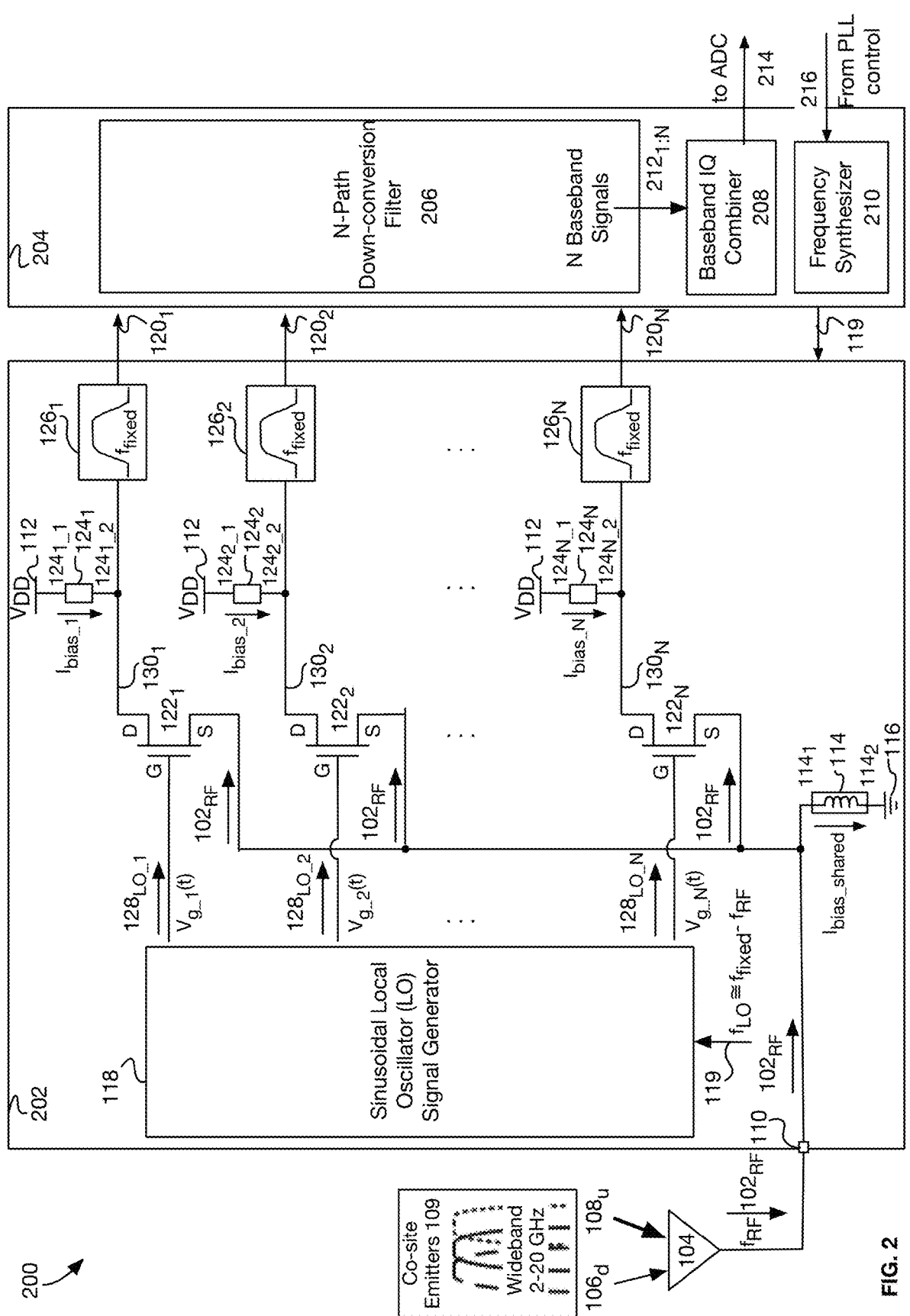
FIG. 2 is a diagram illustrating the receiver circuit of FIG. 1 having the sinusoidal local oscillator signal generator and the N up-conversion paths fabricated on a frontend MMIC according to an embodiment.

FIG. 2 is a diagram illustrating an embodiment of a receiver circuit 200 that is similar to the receiver circuit 100 of FIG. 1, except that receiver circuit 200 includes a frontend monolithic microwave integrated circuit (MMIC) 202 and a backend silicon integrated circuit 204 coupled to the frontend MMIC 202 according to an embodiment. The frontend MMIC 202 includes the sinusoidal LO signal generator 118, N up-conversion paths including transistors $122_{1:N}$ and bandpass filters $126_{1:N}$, and current steering configuration that includes the DC voltage supply rail 112, the impedance loads $124_{1:N}$, and the shared current source 114 according to an embodiment. For example, the frontend MMIC 202 may be fabricated on a substrate comprising a gallium nitride (GaN) material, and the transistor $122_n$ in each up-conversion path may be a high electron mobility transistor (HEMT).

The backend silicon IC 204 may include an N-path down-conversion filter 206, a baseband IQ combiner 208, and a frequency synthesizer 210 according to various embodiments. The N-path down-conversion filter 206 down-converts the filtered up-converted signals $120_{1:N}$ to generate N baseband down-conversion signals $212_{1:N}$. The baseband combiner 208 may be configured to combine the baseband down-conversion signals $212_{1:N}$ and provide a combined baseband signal 214 to an analog to digital converter (ADC) for signal processing applications. The frequency synthesizer 210 may be configured by a control signal 216 from a phased-locked loop (PLL) control system to provide the single-ended sinusoidal voltage signal 119 having the $f_{LO}$ frequency.

Figure 3:
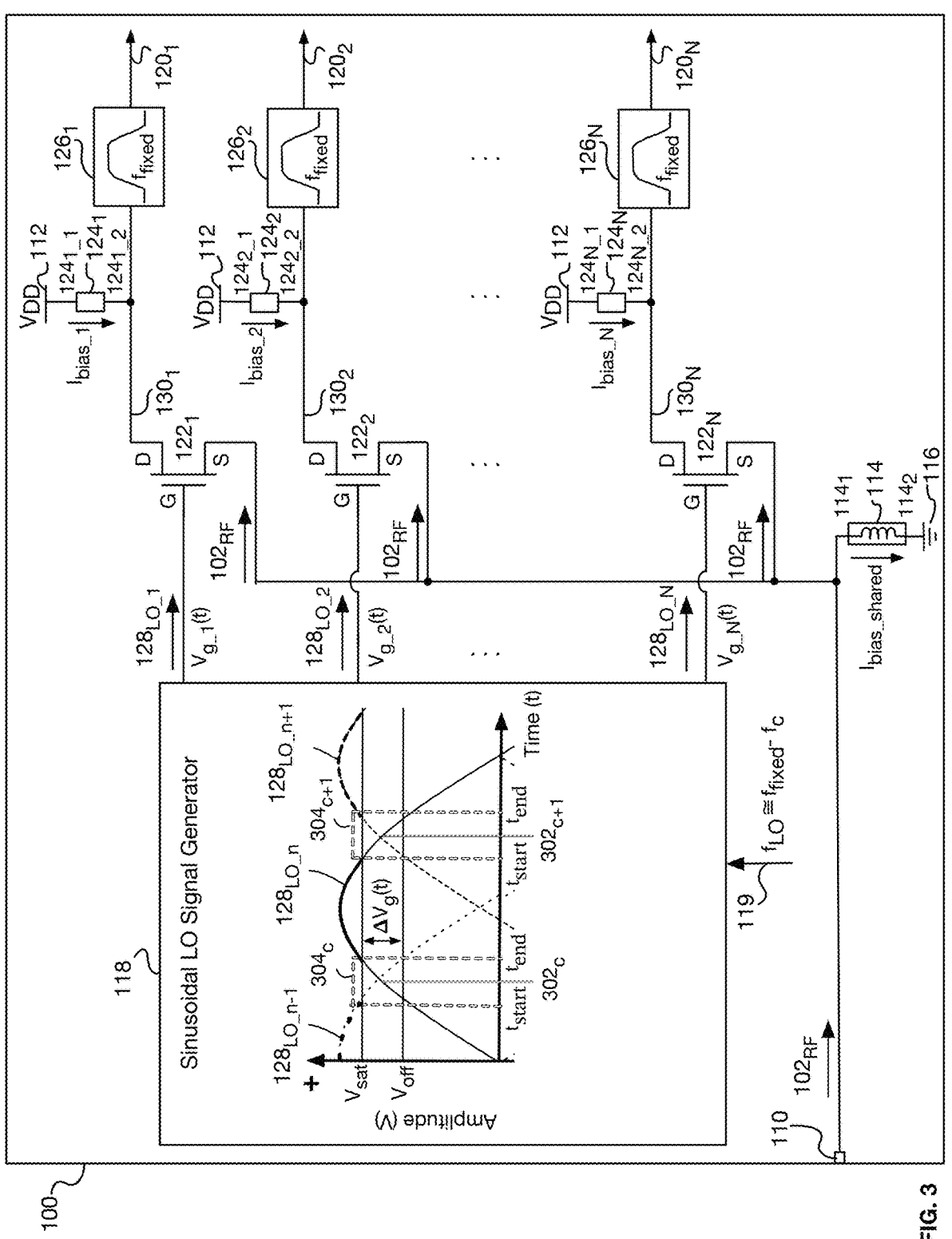
FIG. 3 is a diagram illustrating bias current steering and sinusoidal voltage gate drivers for transistor commutation in the receiver circuit of FIG. 1 according to an embodiment.

FIG. 3 illustrates the bias current steering and the sinusoidal voltage gate drivers for transistor commutation in the receiver circuit 100 of FIG. 1 according to an embodiment. The plurality of sinusoidal voltage signals $128_{1:N}$ comprises a plurality of periodic sinusoidal intersections $302_{1:C}$ that determines a plurality of periodic commutation transition periods $304_{1:C}$. Each sinusoidal intersection $302_c$ determines a commutation transition period $304_c$ of switching between the transistor $122_n$ in the current up-conversion path to the transistor $122_{n+1}$ in the next up-conversion path. The duration of the commutation transition period $304_c$ may be configured to control noise figure and performance characteristics of the receiver circuit 100 according to embodiments.

For example, the commutation transition period $304_c$ includes a transition start time $t_{start}$ and a transition end time $t_{end}$. During the commutation transition period $304_c$, the transistor $122_n$ in the current up-conversion path and the transistor $122_{n+1}$ in the next up-conversion path each operate in a triode mode. By the transition end time $t_{end}$:

1. The transistor $122_n$ in the current up-conversion path switches from operating in the triode mode to a cut-off mode when the time varying amplitude $V_{g\_n}(t)$ of the sinusoidal voltage signals $128_{LO\_n}$ is below a cut-off mode voltage threshold Voff.

2. The transistor $122_{n+1}$ in the next up-conversion path switches from operating in the triode mode to a saturation mode when the sinusoidal voltage signals $128_{LO\_n+1}$ is above a saturation mode voltage threshold $V_{sat}$.

The difference between the saturation mode voltage threshold $V_{sat}$ and the cut-off mode voltage threshold $V_{off}$ determines the duration of the commutation transition period $304_c$ according to an embodiment. Also, the difference between the saturation mode voltage threshold $V_{sat}$ and the cut-off mode voltage threshold $V_{off}$ may be configured to steer substantially all of the shared bias current $I_{bias\text{-}shared}$ to the transistor $122_{n+}$ in the next up-conversion path by the end of the transition time $t_{end}$. Accordingly, substantially all of the shared bias current $I_{bias\_shared}$ is steered as a bias current $I_{bias\_n+1}$ to the transistor $122_{n+1}$ in the next up-conversion path when the time varying amplitude $V_{g\_n+1}(t)$ of the sinusoidal voltage signal $128_{LO\_n+1}$ associated with the gate of the transistor $122_{n+1}$ is above the saturation mode voltage threshold $V_{sat}$.

Figure 4A:
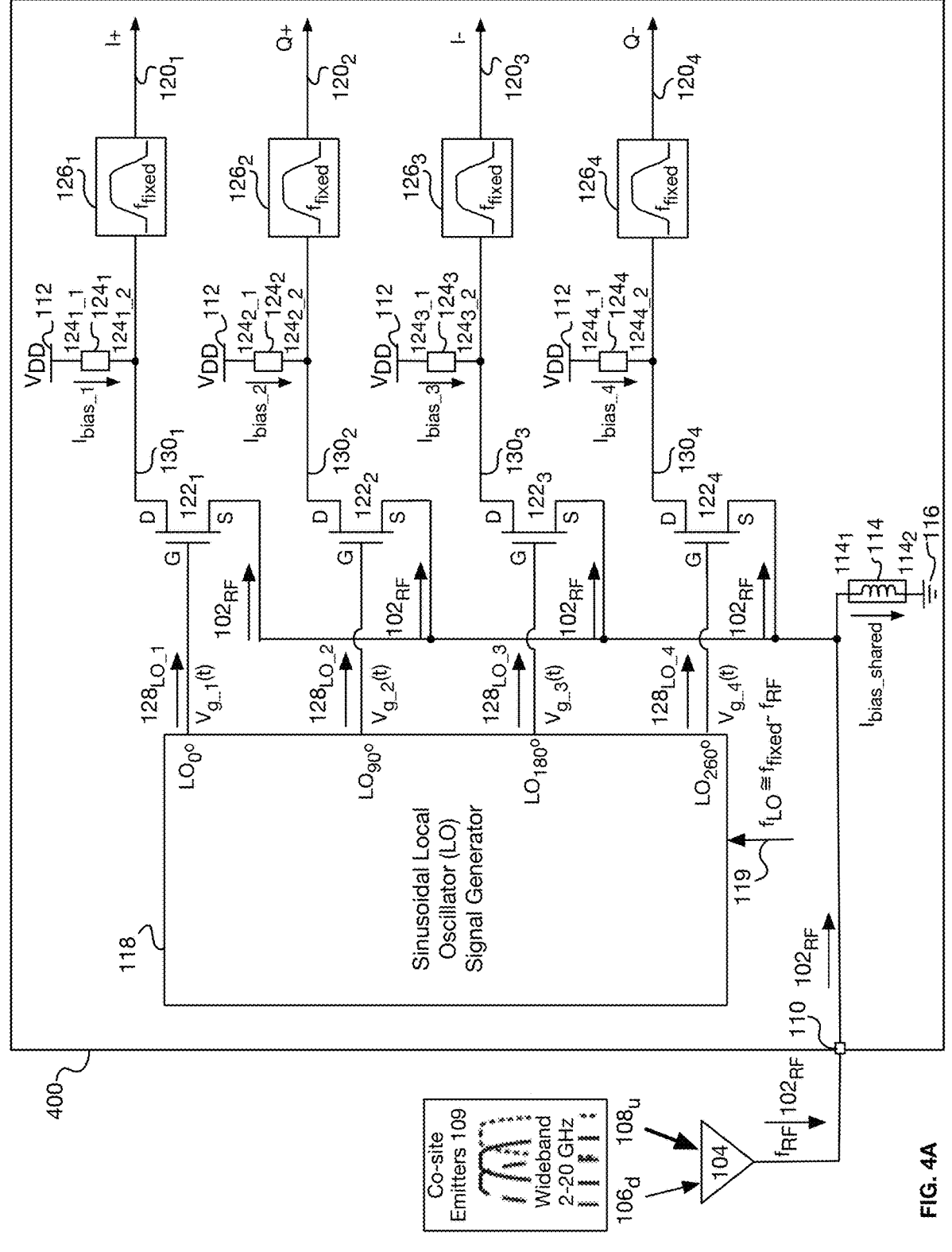
FIGS. 4A-4B are diagrams illustrating transistor commutation between quadrature up-conversion paths in the receiver circuit of FIG. 3 according to an embodiment.
Figure 4B:
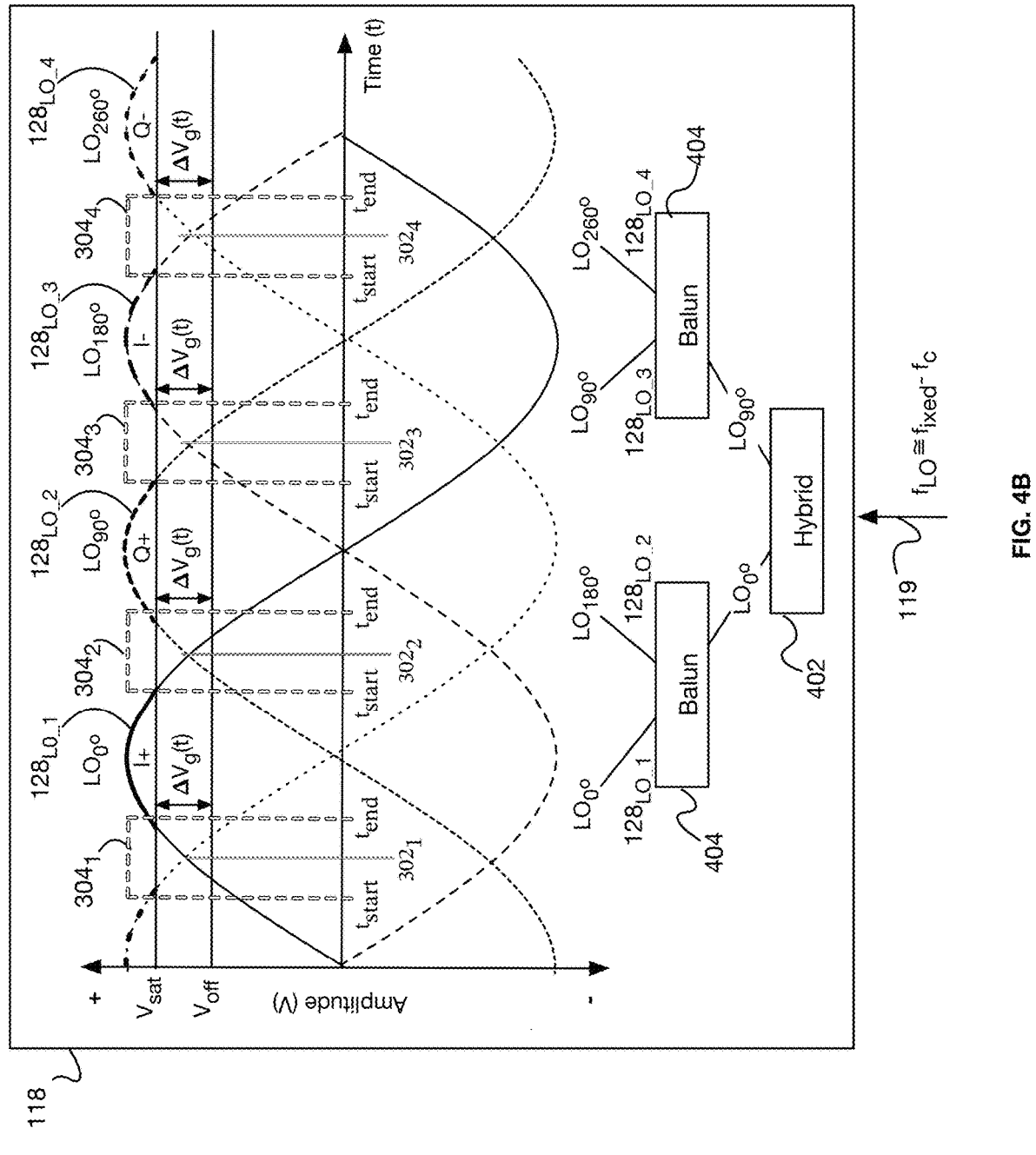

FIG. 4A is a diagram illustrating an embodiment of a receiver circuit 400 that is similar to the receiver circuit 100 of FIG. 1, except that receiver circuit 400 is configured for N=4 up-conversion paths and the sinusoidal LO signal generator 118 is configured to split the single-ended sinusoidal voltage signal 119 into N=4 sinusoidal voltage signals $128_{LO\_1}$ to $128_{LO\_4}$. The up-conversion paths (N=1 to N=4) generate quadrature baseband signals $120_1$ (I+), $120_2$ (Q+), $120_3$ (I−), and $120_4$ (Q−) in response to the shared bias current $I_{bias\_shared}$, the RF input signal $102_{RF}$, and the sinusoidal voltage signals $128_{LO\_1}$ (phase angle $\theta$=0°), $128_{LO\_2}$ ($\theta$=90°), $128_{LO\_3}$ ($\theta$=180°), and $128_{LO\_4}$ ($\theta$=270°). FIG. 4B illustrates the periodic sinusoidal intersections $302_{1:4}$ that determine the periodic commutation transition periods $304_{1:4}$ in the sinusoidal LO signal generator 118 of FIG. 4A. The sinusoidal LO signal generator 118 of FIG. 4A may be configured with wideband quadrature hybrid 402 and subsequent baluns 404 to split the single-ended sinusoidal voltage signal 119 into the sinusoidal voltage signals $128_{LO\_1}$ to $128_{LO\_4}$ that are phase and amplitude balanced signals.

FIG. 5 illustrates a method 500 of rejecting an undesired frequency in a radio frequency (RF) input signal having a center frequency and the undesired frequency. The method includes a block 502 that receives the RF input signal having the center frequency and the undesired frequency. Block 504 generates a plurality of local oscillator (LO) reference voltage signals having an LO frequency and block 506 associates a plurality of transistors with the plurality of LO voltage signals and the RF input signal. Block 508 mixes the RF input signal and one of the plurality of LO reference voltage signals associated with the one of the transistors in the plurality of transistors configured in a saturation mode to generate a mixed signal. The mixed signal includes a first frequency component associated with the center frequency and a second frequency component associated with the undesired frequency of the RF input signal. Block 510 sets a fixed bandpass frequency to pass the first frequency component and reject the second frequency component in the mixed signal to provide a filtered up-converted signal. The fixed bandpass frequency is substantially equal to the LO frequency plus the center frequency.

The method may include setting a fixed bandpass frequency to reject a plurality of second frequency components that are associated with a plurality of undesired frequencies of the RF input signal. The method may further include generating a second frequency component in the mixed signal which is associated with an odd harmonic of the LO frequency while the one of the plurality of LO reference voltage signals is driving a gate of the one of the plurality of transistors to configure the one of the plurality of transistors to operate in the saturation mode. The at least one odd harmonic is associated with the undesired frequency of the RF input signal.

According to an embodiment, the method may include providing a single-ended reference voltage signal having the LO frequency and tuning a sinusoidal local oscillator to generate the plurality of LO reference voltage signals in response to the single-ended reference voltage signal. The method may further include providing the plurality of LO reference voltage signals as a plurality of sinusoidal voltage signals having the LO frequency, and providing a shared bias current. The shared bias current may be cyclically steered to configure one of the plurality of transistors to operate in the saturation mode in response to a time varying amplitude of one of the plurality of sinusoidal voltage signals driving a gate of the one of the plurality of transistors. The method may steer substantially all of the shared bias current (a) to the one of the plurality of transistors when an instantaneous gate voltage from the time varying amplitude of the one of the sinusoidal voltage signals is above a saturation mode voltage threshold $V_{sat}$; and (b) away from another one of the plurality of transistors when an instantaneous gate voltage from the time varying amplitude of other one of the plurality of sinusoidal voltage signals associated with the gate of the other one of the plurality of transistor is below a cut-off mode voltage threshold $V_{off}$.

Figure 6A:
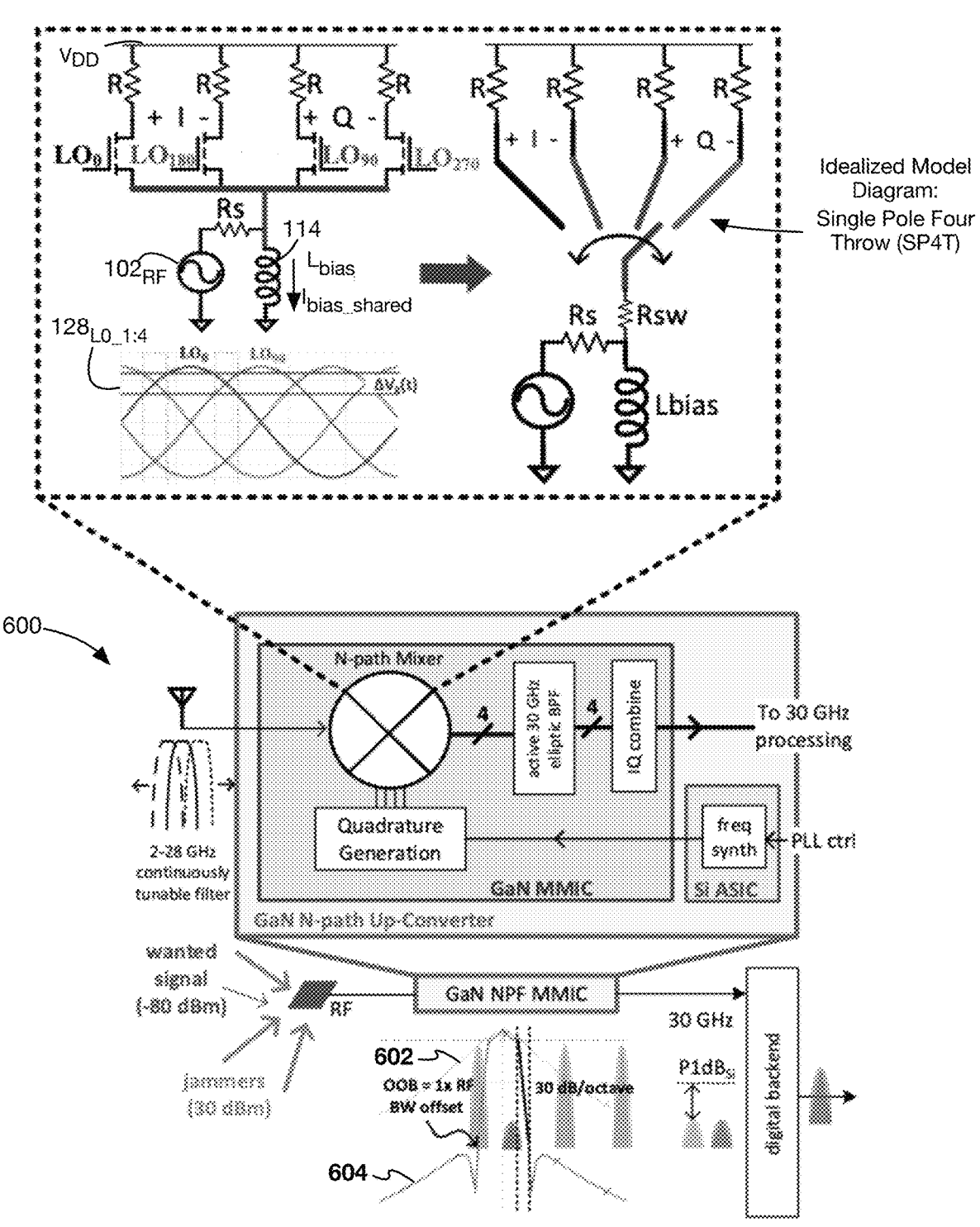
FIG. 6A is a diagram illustrating filter response data for an embodiment of the receiver circuit of FIG. 2.

FIG. 6A is a diagram illustrating a receiver circuit 600 that is similar to the receiver circuit 200 of FIG. 2, except that the receiver circuit 600 is configured with quadrature up-conversion paths with active elliptic bandpass filtering. The up-conversion paths include N-path active mixers with active filters which do not require non-overlapping pulses for gate driving to achieve hard switching and clean commutation (approximating single pole four throw switch in an idealized model) of the quadrature-phased switches according to an embodiment. This is due to the current-steering of the active mixer where $\Delta V_g$ is sufficiently large to draw all current into the branch whose gate voltage is the highest at a given time (t). By using the active mixer, quadrature-phased sinusoids can achieve hard switching of the mixer core devices across a wide-band frequency range according to embodiments.

The N-path mixer I/Q outputs are loaded with active 40 dB elliptic bandpass filters centered at $f_{fixed}$=30 GHz according to an embodiment. The I/Q recombining at a fixed frequency may be achieved with an LC network. Since active filter provides ~40 dB gain and out-of-band rejection, subsequent down-conversion can be performed in photonics or silicon without concern for large out-of-band jammers saturating the receiver.

The receiver circuit 600 may include (1) a wideband quadrature generation block, (2) an N-path up-converter core block, (3) active 30 GHz elliptic bandpass filter blocks, and (4) a 30 GHz I/Q combiner according to an embodiment. For example, the receiver circuit 600 may be an active GaN N-path mixer receiver that includes a high-dynamic-range receiver front-end shown as a GaN MMIC. The GaN MMIC may include the active N-path mixer core and a wideband quadrature signal generation (IQ LO Generation) with sufficient amplitude and phase balance to hard switch the N-path mixer switches with accurate duty cycle.

The up-conversion mixer core may be comprised of 4 4×25 μm HEMT devices with source nodes sharing the RF port with a 2 nH shunt DC biasing inductor. The up-converted I/Q ports are loaded with resistance R to provide a DC current path without significant noise penalty according to an embodiment. HEMT switches are cyclically commutated by quadrature-phase sinusoids biased for 0V "on" with ~2V swing to sample the RF current in 25% duty-cycle windows. In each "on" window, harmonic content is generated at $f_{RF}\pm f_{LO}$ where $f_{RF}$ is the frequency of the signal on the RF port and $f_{LO}$ is the frequency of quadrature-phase sinusoids on the gates of the mixer HEMTs.

The receiver circuit 600 may include an active 30 GHz elliptic bandpass filter load. With the load resistor, both mixer tones are present (such as the sum frequency component and the difference component) in each up-conversion path. With $f_{LO}$=30 GHZ-$f_{RF}$ the up-conversion of the I/Q signal is centered around 30 GHz. In addition to the resistive load, the receiver circuit 600 may include an LC resonant tank (bandpass filter) for 30 GHz in parallel. Consequently, the down-conversion signal (such as the difference frequency component) is filtered out while the 30 GHz (such as the sum frequency component) is preserved. To provide gain and additional filtering of out-of-band signals, active elliptic bandpass filter loads covering 29-31 GHz may be loaded at the drain of each HEMT according to an embodiment. The filter response 602 is the simulated down-converted power with an elliptic low pass filter load, and the filter response 604 is the simulated down-converted power with a single pole bandpass filter load.

Figure 6B:
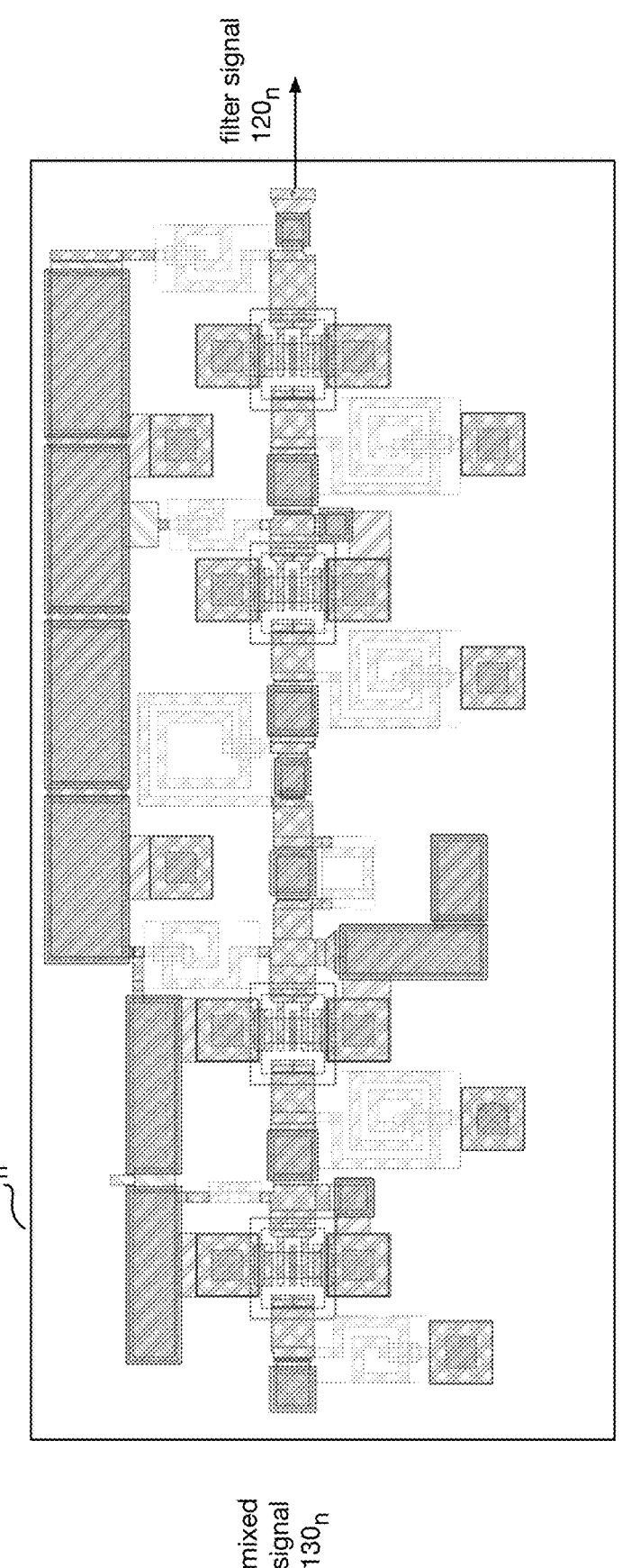
FIG. 6B is a circuit layout of an active elliptical filter in the receiver circuit of FIG. 6A according to embodiment.

FIG. 6B shows a circuit layout of the active elliptical filter in the receiver circuit 600 according to an embodiment. The active elliptical filter may be configured in a multi-stage implementation that includes single pole stages with LC resonant tanks centered around 29 and 31 GHz, respectively. The $2^{nd}$ stage is comprised of shunt LC (pole @ 30 GHz) and 2× series LC tanks (transmission zeros around 29 and 31 GHz). The elliptic bandpass filter may achieve 40 dB gain with 3 dB NF with 2 GHz instantaneous bandwidth according to an embodiment. I/Q signals that fall in-band are re-down-converted to the RF port with gain while I/Q signals that fall out-of-band are re-down-converted to the RF port significantly attenuated. Thus, while out-of-band jammers still cause compression of signals in-band, 10 dB improvement in jammer power handling for 1 dB compression is achieved according to an embodiment.

Figure 6C:
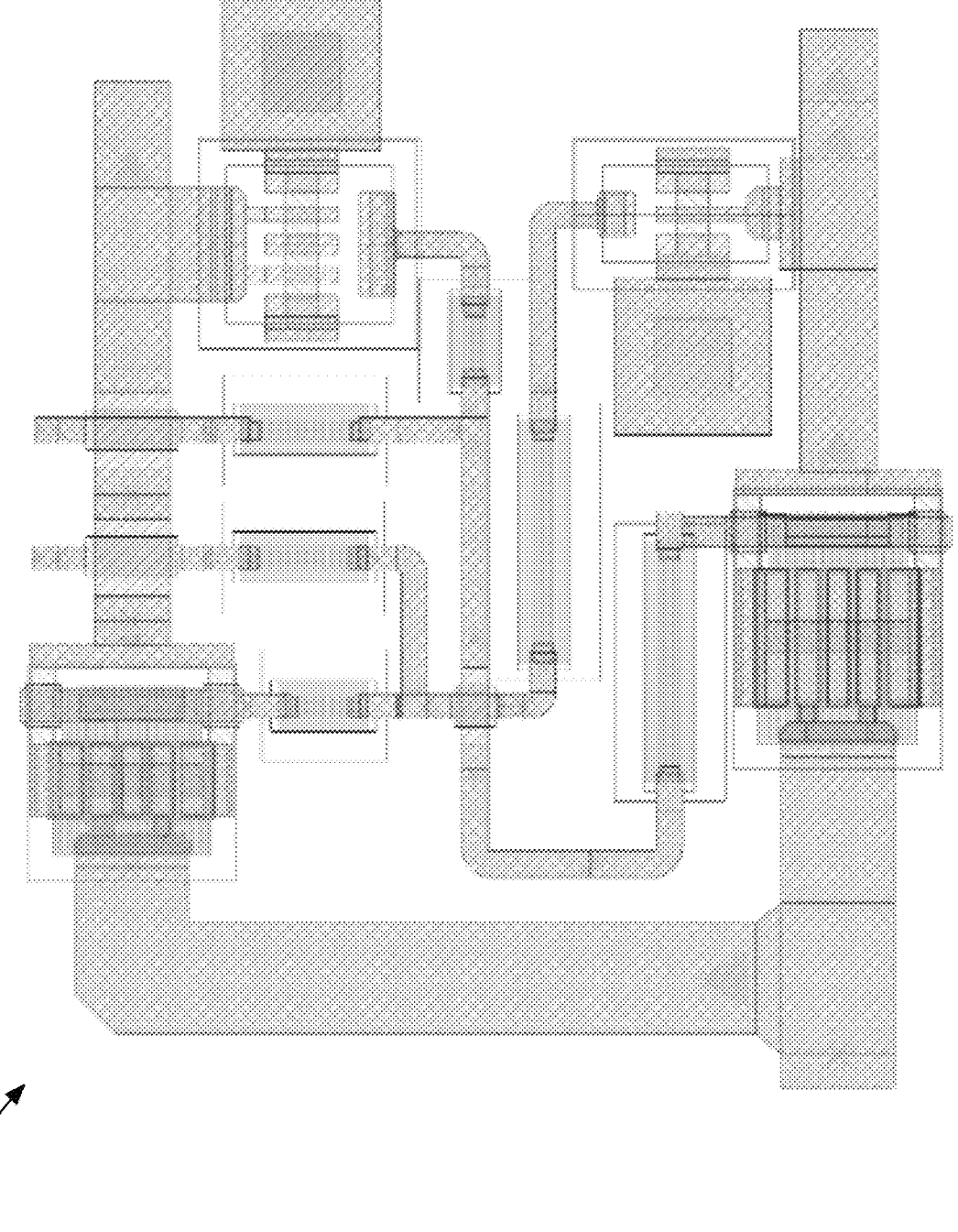
FIG. 6C is a circuit switch layout for switches in the receiver circuit of FIG. 6A according to an embodiment.

FIG. 6C shows a switch layout with 2-8 GHz and 8-40 GHz optimized switches for the receiver circuit 600 of FIG. 6A. The switch layout be configured with GaN switches having minimum routing lengths on the 8-40 GHz path. While 1 dB loss due to switches in the RF path may be a direct 1 dB degradation to receiver sensitivity, a 1 dB loss in the LO path leads to <0.1 dB degradation in the overall system noise figure. In addition to the switch, coupled-line-couplers for both quadrature generation and baluns for 1 dB amplitude imbalance across 4-5 octaves may be designed and nested for compact layout.

Based on simulations which yield a 1 dB degradation in noise figure, a maximum phase error of 10° and amplitude error of 1.5 dB were determined for amplitude and phase balance according to embodiments. While conventional filter banks may switch between filters covering various ranges from 2-18 GHz, a similar switch approach in the LO path (instead of the RF path) can cover 2 ranges from 2-8 GHz and from 8-40 GHz to generate sufficiently balanced I and Q across the full frequency range.

Figure 6D:
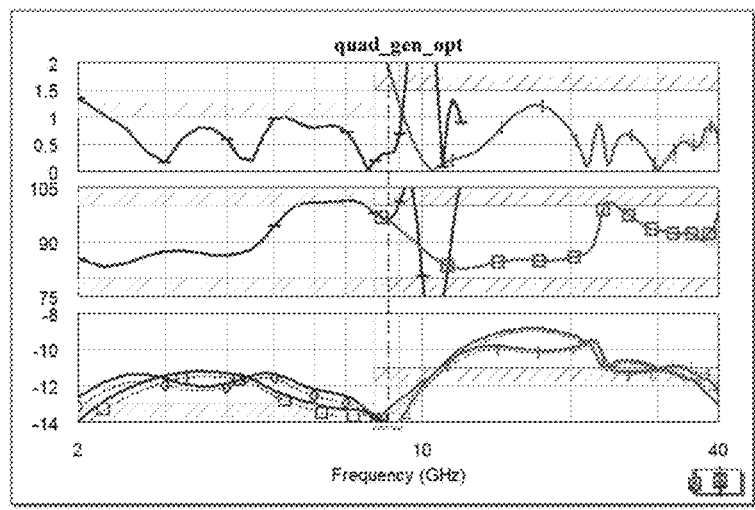
FIGS. 6D-6F show simulation data for the receiver circuit of FIG. 6A according to an embodiment.
Figure 6E:
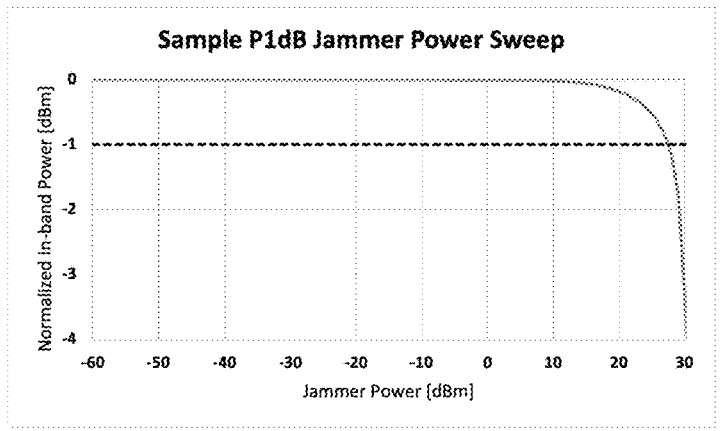
Figure 6F:
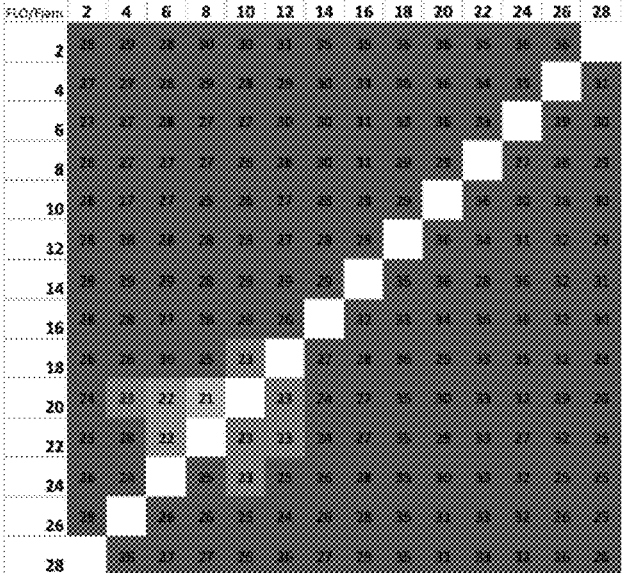

In FIG. 6D, simulation of switched-transmission line quadrature generation from 2-40 GHz shows amplitude error between quadrature-phased gate drive signals is below 1.5 dB and 10° across the full tuning range with switch selecting between 2-8.5 GHz and 8.5-40 GHz. In FIG. 6E, simulation data shows the response of the active elliptical filter amplifier to an out-of-band interference signal at various power levels. The out-of-band interference signal (jammer) is set at 2 GHz and the active elliptical bandpass filter has a passband frequency ranging from 3-5 GHz. This example demonstrates the robustness of up-conversion receiver to out-of-band jammer power up to 29 dBm. In FIG. 6F, simulations of P1dB across swept jammer frequency and receiver frequency show >21 dBm P1dB across all frequencies and >24 dBm across 95% of the possible receive frequency with jammer frequency combinations.

FIGS. 7A-7B show odd harmonics $3F_{LO}$ and $5F_{LO}$ leaking into baseband conversion with a conventional N-path passive mixer/filter illustrated in an idealized model diagram. The 25% duty-cycle pulses for driving conventional N-path filters causes energy at the odd harmonics to leak into and corrupt the baseband signal.

FIGS. 8A-8B are diagrams illustrating up-converting N-path passive mixer with bandpass filtering to reject odd harmonics $3F_{LO}$ and $5F_{LO}$ according to an embodiment. FIG. 8A illustrates an embodiment of the up-conversion architecture in an idealized model diagram where for a fixed bandpass frequency $f_{fixed}$ at 30 GHz with 2 GHz instantaneous bandwidth, signals that lie outside the passband of $Z_{IQ}$ (undesired signal components in the mixed signal) are attenuated by the filter and signals in the up-converted passband are preserved (desired signal component in the mixed signal). Signals outside of the passband are attenuated at the RF port, while up-converting signals around the center frequency $f_{RF}$ to the fixed bandpass frequency $f_{fixed}$. The ideal 25% duty-cycle pulses commutate and up-convert RF signal to quadrature I/Q outputs. After active-elliptic bandpass filtering at 30 GHz, the filtered I/Q signals may be down-converted to baseband and recombined to single-ended or differential outputs according to an embodiment. Alternatively, the filtered I/Q signals may be recombined before subsequent down-conversion to baseband.

The receiver circuits in FIGS. 1-6 illustrate embodiments of an N-path active mixer with current steering for relaxed gate drive signal generation in the up-conversion paths for wide-band mm-wave frequency range. For example, the relaxed gate drive allows for lower power consumption and ultra-wideband mm frequencies in a range of 2 GHz to at least 40 GHz.

A number of example embodiments have been described. Nevertheless, it will be understood that various modifications may be made without departing from the spirit and scope of the devices and methods described herein.

What is claimed is:

1. A receiver circuit for rejecting an undesired frequency in a radio frequency (RF) input signal having a center frequency and the undesired frequency, the receiver circuit comprising:

an RF input terminal configured to receives the RF input signal;

a plurality of up-conversion paths configured to provide a plurality of filtered up-converted signals, wherein each up-conversion path comprises a transistor and a bandpass filter; and a local oscillator (LO) signal generator configured to provide a plurality of reference voltage signals having an LO frequency; and wherein for each up-conversion path in the plurality of up-conversion paths:

the transistor has a source coupled to the RF input terminal, a drain coupled to the bandpass filter, and a gate coupled to the LO signal generator to receive one of the reference voltage signals;

the drain of the transistor is configured to provide a mixed signal in response to the one of the reference voltage signals at the gate of the transistor and the RF input signal at the source of the transistor;

the bandpass filter is configured at a fixed bandpass frequency to pass a first frequency component and reject second frequency component in the mixed signal to provide one of the filtered up-converted signals in the plurality of filtered up-converted signals, wherein the first frequency component is associated with the center frequency and the second frequency component is associated with the undesired frequency of the RF input signal; and the fixed bandpass frequency is substantially equal to the LO frequency plus the center frequency.

2. The receiver circuit of claim 1, wherein the fixed bandpass frequency is configured to reject a plurality of second frequency components that are associated with a plurality of undesired frequencies of the RF input signal.

3. The receiver circuit of claim 1, wherein the first frequency component is a sum frequency component and the second frequency component is a difference frequency component.

4. The receiver circuit of claim 1, wherein the fixed bandpass frequency is determined from a range of center frequencies and another range of undesired frequencies.

5. The receiver circuit of claim 4, wherein:

the range of center frequencies has a maximum center frequency;

the other range of undesired frequencies has a maximum undesired frequency; and the fixed bandpass frequency is greater than at least a sum of about 1.5 times the maximum center frequency plus about 0.5 times the maximum undesired frequency.

6. The receiver circuit of claim 1, wherein the fixed bandpass frequency is at least 8 GHz.

7. The receiver circuit of claim 1, wherein the second frequency component is associated with an odd harmonic of the LO frequency in response to the one of the reference voltage signals driving the gate of the transistor to periodically configure the transistor to operate in a saturation mode.

8. The receiver circuit of claim 1, further comprising:

a DC voltage rail configured to provide a DC voltage supply, wherein the DC voltage rail is coupled to the drain of the transistor in each up-conversion path; and a shared current source coupled to the source of the transistor in each up-conversion path;

wherein:

the LO signal generator is a sinusoidal LO signal generator, and the plurality of reference voltage signals is a plurality of sinusoidal voltage signals having the LO frequency; and the shared current source is configured to draw a shared bias current from the DC voltage supply, wherein the shared bias current is cyclically steered to the transistor in each up-conversion path in response to a time varying amplitude of one of the plurality of sinusoidal voltages signals associated with the gate of the transistor.

9. A radio frequency (RF) receiver circuit comprising:

an RF input terminal configured to receive an RF input signal comprising a desired signal having a center frequency and an undesired signal having an undesired frequency;

N up-conversion paths configured to provide N filtered up-converted signals, wherein an $n^{th}$ up-conversion path comprises an $n^{th}$ transistor and an $n^{th}$ bandpass filter, where the subscript n is an integer 1 to N and N is an integer of 2 or more and corresponds to a number of up-conversion paths; and a local oscillator (LO) signal generator configured to provide N reference voltage signals having an LO frequency:

wherein:

the $n^{th}$ transistor has a source coupled to the RF input terminal, and a drain coupled to the $n^{th}$ bandpass filter, and a gate coupled to the LO signal generator to receive an $n^{th}$ reference voltage signal;

the drain of the $n^{th}$ transistor is configured to provide an $n^{th}$ mixed signal in response to the $n^{th}$ reference voltage signal at the gate of the $n^{th}$ transistor and the RF input signal at the source of the $n^{th}$ transistor;

the $n^{th}$ bandpass filter is configured at a fixed bandpass frequency to pass a first frequency component and reject a second frequency component in the $n^{th}$ mixed signal to provide an $n^{th}$ filtered up-converted signals, wherein the first frequency component is associated with the center frequency and the second frequency component is associated with the undesired frequency of the RF input signal; and the fixed bandpass frequency is substantially equal to the LO frequency plus the center frequency.

10. The receiver circuit of claim 9, wherein the fixed bandpass frequency is configured to reject a plurality of second frequency components that are associated with a plurality of undesired frequencies of the RF input signal.

11. The receiver circuit of claim 9, wherein the first frequency component is a sum frequency component and the second frequency component is a difference frequency component.

12. The receiver circuit of claim 9, wherein:

the fixed bandpass frequency is determined from a range of center frequencies and another range of undesired frequencies;

the range of center frequencies has a maximum center frequency;

the other range of undesired frequencies has a maximum undesired frequency; and the fixed bandpass frequency greater than at least a sum of about 1.5 times the maximum center frequency plus about 0.5 times the maximum undesired frequency.

13. The receiver circuit of claim 9, wherein the second frequency component is associated with an odd harmonic of the LO frequency in response to the $n^{th}$ reference voltage signal driving the gate of the $n^{th}$ transistor to periodically configure the $n^{th}$ transistor to operate in a saturation mode.

14. The receiver circuit of claim 9, further comprising:

a DC voltage rail configured to provide a DC voltage supply, wherein the DC voltage rail is couped to the drain of the $n^{th}$ transistor; and a shared current source coupled to the source of the $n^{th}$ transistor;

wherein:

the LO signal generator is a sinusoidal LO signal generator, and the N reference voltage signals is N sinusoidal voltage signals having the LO frequency; and the shared current source is configured to draw a shared bias current from the DC voltage supply, wherein the shared bias current is cyclically steered to the $n^{th}$ transistor in response to a time varying amplitude of an $n^{th}$ LO sinusoidal voltages signal associated with the gate of the $n^{th}$ transistor.

15. The receiver circuit of claim 9, further comprising:

a frontend monolithic microwave integrated circuit (MMIC) fabricated on a substrate comprising a gallium nitride (GaN) material; and a backend silicon integrated circuit (IC) coupled to the frontend MMIC wherein:

the frontend MMIC comprises the LO signal generator and the N up-conversion paths;

the backend silicon IC comprises a frequency synthesizer configured to provide a single-ended reference voltage signal having the LO frequency; and the LO signal generator is a tunable LO signal generator that generates the N reference voltage signals in response to the single-ended reference voltage signal.

16. The receiver circuit of claim 15, wherein the backend silicon IC comprises a backend N-path down-conversion filter coupled to the N up-conversion paths to generate N baseband conversion signals in response to the N filtered up-converted signals.

17. A method of rejecting an undesired frequency in a radio frequency (RF) input signal having a center frequency and the undesired frequency, the method comprising:

receiving the RF input signal comprising the center frequency and the undesired frequency;

generating a plurality of local oscillator (LO) reference voltage signals having an LO frequency:

associating a plurality of transistors with the plurality of LO reference voltage signals and the RF input signal;

mixing the RF input signal and one of the plurality of LO reference voltage signals associated with one of the transistors in the plurality of transistors that is configured in a saturation mode to generate a mixed signal having a first frequency component associated with the center frequency and a second frequency component associated with the undesired frequency; and setting a fixed bandpass frequency to pass the first frequency component and reject the second frequency component in the mixed signal to provide a filtered up-converted signal, wherein the fixed bandpass frequency is substantially equal to the LO frequency plus the center frequency.

18. The method of claim 17, further comprising:

setting the fixed bandpass frequency to reject a plurality of second frequency components that are associated with a plurality of undesired frequencies of the RF input signal.

19. The method of claim 17, further comprising:

providing the plurality of LO reference voltage signals as a plurality of sinusoidal voltage signals having the LO frequency:

providing a shared bias current; and steering the shared bias current to configure one of the plurality of transistors to operate in the saturation mode in response to a time varying amplitude of one of the plurality of sinusoidal voltage signals in the plurality of sinusoidal voltage signals driving a gate of the one of the plurality of transistors.

20. The method of claim 19, further comprising:

steering substantially all of the shared bias current to the one of the plurality of transistors when an instantaneous gate voltage from the time varying amplitude of the one of the plurality of sinusoidal voltage signals is above a saturation mode voltage threshold $V_{sat}$.

21. The method of claim 17, further comprising:

providing a single-ended reference voltage signal having the LO frequency; and

13

14 tuning a sinusoidal local oscillator to generate the plural-
ity of LO reference voltage signals in response to the
single-ended reference voltage signal.

* * * * *